United States Patent
Rahmatian et al.

(10) Patent No.: US 7,633,285 B2
(45) Date of Patent: Dec. 15, 2009

(54) SENSORS AND SENSING METHODS FOR THREE-PHASE, GAS INSULATED DEVICES

(75) Inventors: Farnoosh Rahmatian, Vancouver (CA); James N. Blake, Paradise Valley, AZ (US)

(73) Assignee: NxtPhase T&D Corporation, Vancouver (CA)

( * ) Notice: Subject to any disclaimer, the term of this patent is extended or adjusted under 35 U.S.C. 154(b) by 311 days.

(21) Appl. No.: 11/881,864

(22) Filed: Jul. 30, 2007

(65) Prior Publication Data

US 2008/0186012 A1 Aug. 7, 2008

Related U.S. Application Data

(60) Provisional application No. 60/834,535, filed on Jul. 31, 2006.

(51) Int. Cl.
*G01R 19/00* (2006.01)
(52) U.S. Cl. .................................................... 324/107
(58) Field of Classification Search ................. 324/96, 324/117 R, 117 H, 158.1, 765, 126; 702/61, 702/65, 107; 174/24–28; 257/48; 438/14–18
See application file for complete search history.

(56) References Cited

U.S. PATENT DOCUMENTS

| | | | |
|---|---|---|---|
| 5,029,273 A | 7/1991 | Jaeger | |
| 5,066,903 A * | 11/1991 | Ochi | 324/96 |
| 5,136,236 A | 8/1992 | Bohnert et al. | |
| 5,295,207 A | 3/1994 | Dupraz et al. | |
| 5,410,243 A | 4/1995 | Tagawa et al. | |
| 5,644,397 A | 7/1997 | Blake | |
| 5,696,858 A | 12/1997 | Blake | |
| 6,188,811 B1 | 2/2001 | Blake | |
| 6,509,522 B1 * | 1/2003 | Okabe et al. | 174/28 |
| 6,680,665 B2 | 1/2004 | Aoki et al. | |
| 6,909,977 B2 | 6/2005 | Orton | |
| 2003/0178891 A1 | 9/2003 | Miyamoto et al. | |

OTHER PUBLICATIONS

International Search Report for PCT/US07/16985 mailed May 28, 2008.
Written Opinion for PCT/US07/16985 mailed May 28, 2008.
Yatsuzuka, H., et al. "New 550-kV Gas-Insulated Switchgear," Hitachi Review, vol. 48, No. 5, 1999, pp. 285-289.

* cited by examiner

*Primary Examiner*—Ha Tran T Nguyen
*Assistant Examiner*—Tung X Nguyen
(74) *Attorney, Agent, or Firm*—Potomac Patent Group PLLC

(57) ABSTRACT

Multi-phase, gas insulated electrical switchgear with optical voltage and/or current sensors are described. Compensation for contributions to sensor readings from non-associated conductors is provided. A processor is connected to voltage and/or current sensors which are placed near conductor whose voltages and/or currents are to be measured. The processor can receive outputs from those sensors and compensate the outputs for contributions which are attributable to sources other than the conductors which are intended to be measured.

30 Claims, 9 Drawing Sheets

US 7,633,285 B2

SENSORS AND SENSING METHODS FOR THREE-PHASE, GAS INSULATED DEVICES

RELATED APPLICATIONS

This application is related to, and claims priority from, U.S. Provisional Patent Application Ser. No. 60/834,535, filed on Jul. 31, 2006, entitled "Sensors and Sensing Methods for Three-Phase, Gas Insulated Devices", the disclosure of which is incorporated here by reference.

BACKGROUND

The present invention pertains to electrical devices and, more particularly, to sensors and sensing methods suitable for three-phase, gas insulated devices, e.g., switchgears and transmission lines.

Electrical power transmission/distribution systems typically provide for a switch to be interposed between a transformer and a line in the system. This switch (commonly referred to as "switchgear") provides a mechanism whereby the transformer can be disconnected from the rest of the system in response to, e.g., a power surge or other type of system occurrence. Recently, switchgear has been insulated using an insulating gas, e.g., $SF_6$, since the insulating properties of such gases enable the overall size of the switchgear to be reduced significantly. Initially, gas insulated switchgear was proposed as a single phase solution, i.e., each of the three phases had a separately packaged switch associated therewith. More recently, to further reduce the size associated with the switchgear, three-phase, gas insulated switchgear has been proposed, an example of which is described in U.S. Published Patent Application No. 2003/0178891, the disclosure of which is incorporated here by reference.

FIG. 1 illustrates a conventional, single-phase, gas insulated switchgear (GIS) device 1. Therein, the GIS device includes bus bars 2 for each pole, disconnection switches 3, grounding switches 4, 5 and circuit breaker 6. Each of the three enclosures 11 associated with a single phase of the GIS device 1, is filled with an insulating gas, e.g. $SF_6$ gas. The enclosures also include mechanical parts of the switches, e.g., contacts, drive mechanisms, etc., associated with the GIS device I and the electrical conductor (not shown in FIG. 1) which conducts its respective phase's current through the switchgear 1. This configuration is referred to herein as "single-phase, gas insulated switchgear" because current associated with each of the three electrical phases is conveyed via a conductor which is enclosed within its own, gas insulated ground enclosure 11.

By way of contrast, three-phase gas insulated switchgear refers to switchgear wherein three conductors (one for each phase) are conveyed through a single, insulating gas-filled enclosure, an example of which is illustrated in FIG. 2. Therein, the three separate enclosures 11 shown in FIG. 1 are replaced by a single enclosure 20 having two endcaps 22 and three electrical conductors 24, 26, and 28 (one for each phase) extending between the two endcaps 22. In practice, an enclosing cover (not shown) would surround the three conductors and completely enclose the region between the two endcaps 22, but this has been removed in FIG. 2 to illustrate the orientation of the conductors.

In electrical switchgear, it can be useful to measure the current flowing through each conductor and the voltage between two electrodes, e.g. a high voltage conductor and ground. Various types of sensors have been used in single-phase, gas insulated switchgear to perform these functions. For example, current and voltage transformers or optical current and voltage sensors have been placed individually proximate to each enclosure 11 to monitor that phase's current and/or voltage. However, the introduction of three-phase GIS devices complicates the sensing environment since all three phases are carried within a single enclosure.

Accordingly, it would be desirable to provide sensors and sensing methods which are able to accurately detect current and/or voltage in three-phase GIS devices.

SUMMARY

According to one exemplary embodiment of the present invention, a three-phase, gas insulated device includes an enclosure having first, second and third conductors extending therethrough, each of the first, second and third conductors associated with a different electrical phase; an insulating gas within the enclosure; a first voltage sensor, disposed within the enclosure and positioned proximate to the first conductor for sensing a first voltage associated therewith; a second voltage sensor, disposed within the enclosure and positioned proximate to the second conductor for sensing a second voltage associated therewith; a third voltage sensor, disposed within the enclosure and positioned proximate to the third conductor for sensing a third voltage associated therewith; and a processor, connected to the first, second and third voltage sensors, for receiving outputs therefrom and determining voltages associated with the first, second and third conductors by compensating for contributions to the outputs from the first, second and third voltage sensors associated with those of the first, second and third conductors other than a conductor proximate thereto.

According to another exemplary embodiment of the present invention, a method for sensing voltages associated with conductors in three-phase, gas insulated switchgear includes the steps of: sensing a first voltage associated with a first conductor extending through the three-phase, gas insulated switchgear using a first voltage sensor proximate thereto; sensing a second voltage associated with a second conductor extending through the three-phase, gas insulated switchgear using a second voltage sensor proximate thereto; sensing a third voltage associated with a third conductor extending through the three-phase, gas insulated switchgear using a third voltage sensor proximate thereto; and compensating the first, second and third voltages for sensed contributions associated with those of the first, second and third conductors other than a conductor proximate to a respective one of the first, second and third voltage sensors.

According to another exemplary embodiment of the present invention, a three-phase, gas insulated switchgear device includes an enclosure having two endcaps and first, second and third conductors extending therethrough, each of the first, second and third conductors associated with a different electrical phase; an insulating gas within the enclosure; a first current sensor, positioned proximate to the first conductor for sensing a first current associated therewith; a second current sensor, positioned proximate to the second conductor for sensing a second current associated therewith; a third current sensor, positioned proximate to the third conductor for sensing a third current associated therewith; and a processor, connected to the first, second and third current sensors, for receiving outputs therefrom and determining currents associated with the first, second and third conductors by compensating for contributions to the outputs from said first, second and third current sensors associated with those of the first, second and third conductors other than a conductor proximate thereto.

According to another exemplary embodiment of the present invention, a method for sensing currents associated with conductors in three-phase, gas insulated switchgear, the method includes the steps of: sensing a first current associated with a first conductor extending through the three-phase, gas insulated switchgear using a first current sensor proximate thereto; sensing a second current associated with a second conductor extending through the three-phase, gas insulated switchgear using a second current sensor proximate thereto; sensing a third current associated with a third conductor extending through the three-phase, gas insulated switchgear using a third current sensor proximate thereto; and compensating the first, second and third currents for sensed contributions associated with those of the first, second and third conductors other than a conductor proximate to a respective one of the first, second and third current sensors.

According to still another exemplary embodiment of the present invention, a multi-phase, insulated electrical device includes an enclosure having at least a first and a second conductor extending therethrough, each of said first and second conductors associated with a different electrical phase, one of an insulating gas and a vacuum within the enclosure, a first voltage sensor, disposed within the enclosure and positioned proximate to the first conductor for sensing a first voltage associated therewith, a second voltage sensor, disposed within the enclosure and positioned proximate to the second conductor for sensing a second voltage associated therewith, and a processor, connected to the first and second voltage sensors, for receiving outputs therefrom and determining voltages associated with the first and second conductors by compensating for contributions to the outputs from the first and second voltage sensors associated with those of the first and second conductors other than a conductor proximate thereto.

According to yet another exemplary embodiment, a multi-phase, insulated electrical device includes an enclosure having first and second conductors extending therethrough, each of said first and second conductors associated with a different electrical phase, one of an insulating gas and a vacuum within the enclosure, a first current sensor, disposed within the enclosure and positioned proximate to the first conductor for sensing a first current associated therewith, a second current sensor, disposed within the enclosure and positioned proximate to the second conductor for sensing a second current associated therewith, and a processor, connected to the first and second current sensors, for receiving outputs therefrom and determining currents associated with the first and second conductors by compensating for contributions to the outputs from the first and second current sensors associated with those of the first and second conductors other than a conductor proximate thereto.

An insert for a gas-insulated switchgear device, the insert including a substantially ring-shaped outer, ground conductor, a conductive or semi-conductive inner ground plate extending inwardly from the substantially ring-shaped outer, ground conductor, a plurality of openings formed in said inner ground plate, and a plurality of fiber optic current sensors which extend through the inner ground plate, each surrounding a corresponding one of the plurality of openings.

BRIEF DESCRIPTION OF THE DRAWINGS

The accompanying drawings illustrate exemplary embodiments of the present invention, wherein.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims.

Voltage Sensing Arrangement

Figure 3:
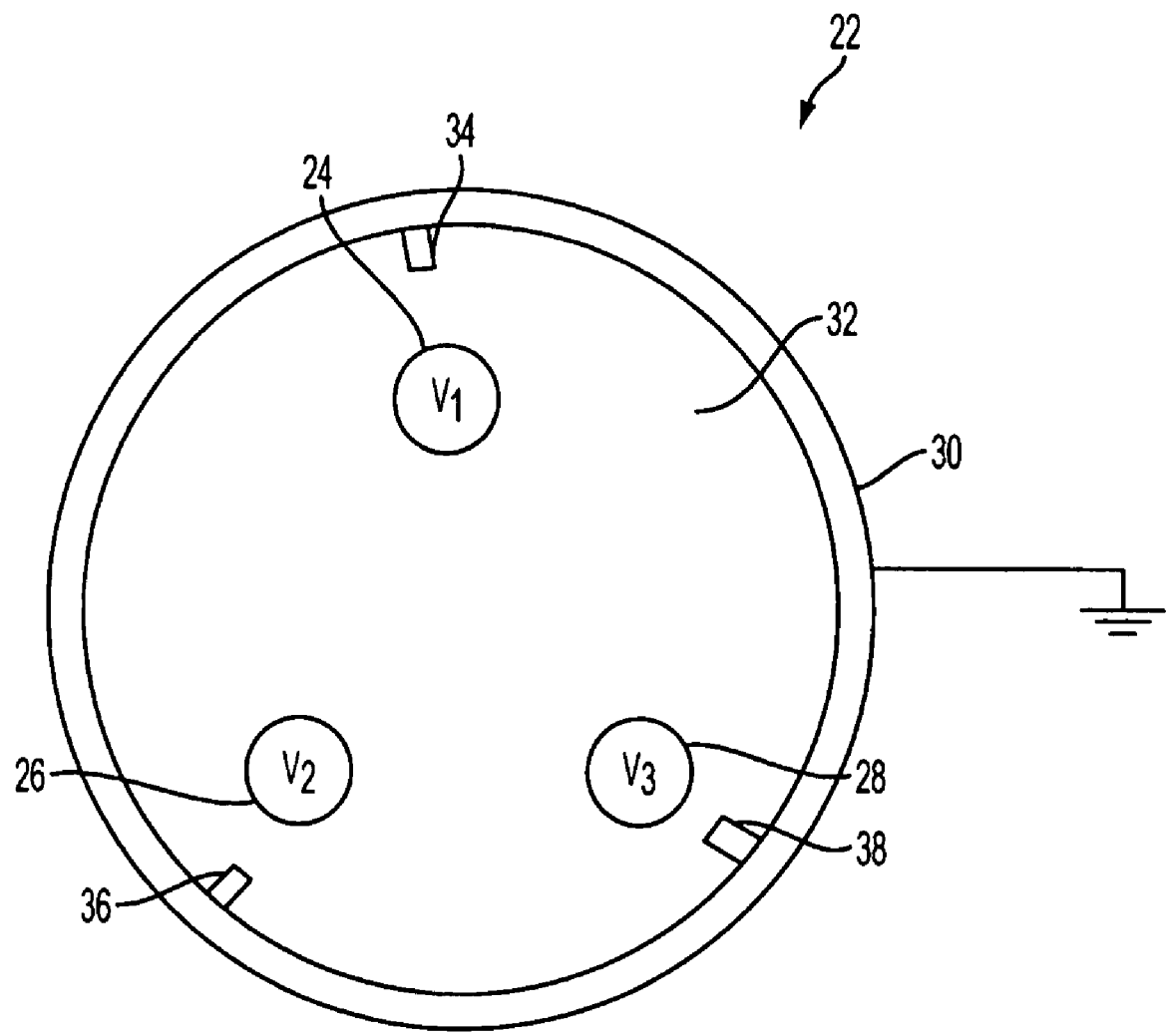
FIG. 3 illustrates a cross-section of a three-phase, gas insulated switchgear device including a voltage sensing arrangement according to an exemplary embodiment of the present invention.

FIG. 3 illustrates a front view of a cross-section 22 of a three-phase GIS device having an optical voltage sensing arrangement in accordance with an exemplary embodiment of the present invention. This exemplary cross-section 22 includes a metallic outer layer 30 which is grounded, and an inner insulating medium 32 through which the conductors 24, 26 and 28 extend. Associated with each of the three conductors 24, 26 and 28 is a respective optical voltage sensor 34, 36, and 38. In an exemplary embodiment of the present invention, the optical voltages sensors 34, 36, and 38 are embedded in a resin layer 32 proximate to their respective conductors 24, 26 and 28. In the context of this specification, a sensor is "proximate to" a particular conductor in the sense that it is more distant from the other two conductors.

According to this exemplary embodiment of the present invention, the optical voltage sensors 34, 36 and 38 can be implemented using so-called Pockels cells. Pockels cells operate on the principle that the polarization of light changes as it passes through an electro-optic crystal (Pockels cell), e.g., from circularly polarized to elliptically polarized, based on the intensity of an electric field in which the Pockels cell is located. An example of a Pockels cell voltage sensor is found in U.S. Pat. No. 5,029,273, the disclosure of which is incorporated here by reference. Not illustrated in FIG. 3, an optical fiber conveys light to and from the Pockels cell in each of the optical voltage sensors 34, 36 and 38. The light returned from each Pockels cell is evaluated to determine its respective change in polarization, which data is returned to a digital data processing device ("processor"), also not illustrated.

The outputs of each of the optical voltage sensors 34, 36 and 38 are indicative of the electric field at their respective location and thus substantially indicative of the voltage of their respective electrical conductors 24, 26 and 28. However, despite being placed proximate their respective conductors, the output of each of the optical voltage sensors will also have a contribution associated with the electrical fields generated by the other conductors inside the device 22. That is, optical voltage sensor 34 will detect an electric field intensity based primarily on the electric field generated by conductor 24, but which will also have a contribution from the electric fields generated by conductors 26 and 28. Likewise, optical voltage sensors 36 and 38 will detect an electric field intensity based primarily on the electric fields generated by conductors 26 and 28, respectively, but will also receive contributions from the other conductors.

In order to accurately determine the voltages associated with the conductors 24, 26 and 28, respectively, the outputs from the optical voltage sensors 34, 36 and 38 can be processed to compensate for the contributions to their outputs derived from the conductors other than the conductor proximate thereto. A processor (not shown) is typically disposed outside of the three-phase GIS device and connected to the optical voltage sensors 34, 36 and 38 via optical fibers. According to one exemplary embodiment of the present invention, the data received by a processor from the optical voltage sensors can be processed as follows to determine those voltages. First, since the detected voltages V1, V2 and V3 associated with each of the three optical voltage sensors 34, 36 and 38 are a function of contributions from each of the three electric fields generated by voltages P1, P2 and P3 associated with the three conductors 24, 26 and 28, these voltages can be expressed as:

$$\begin{bmatrix} V1 \\ V2 \\ V3 \end{bmatrix} = M \begin{bmatrix} P1 \\ P2 \\ P3 \end{bmatrix} \quad (1)$$

where M is a 3×3 matrix of contribution coefficients that can be written as:

$$M = \begin{bmatrix} abc \\ def \\ ghi \end{bmatrix}$$

Figure 4:
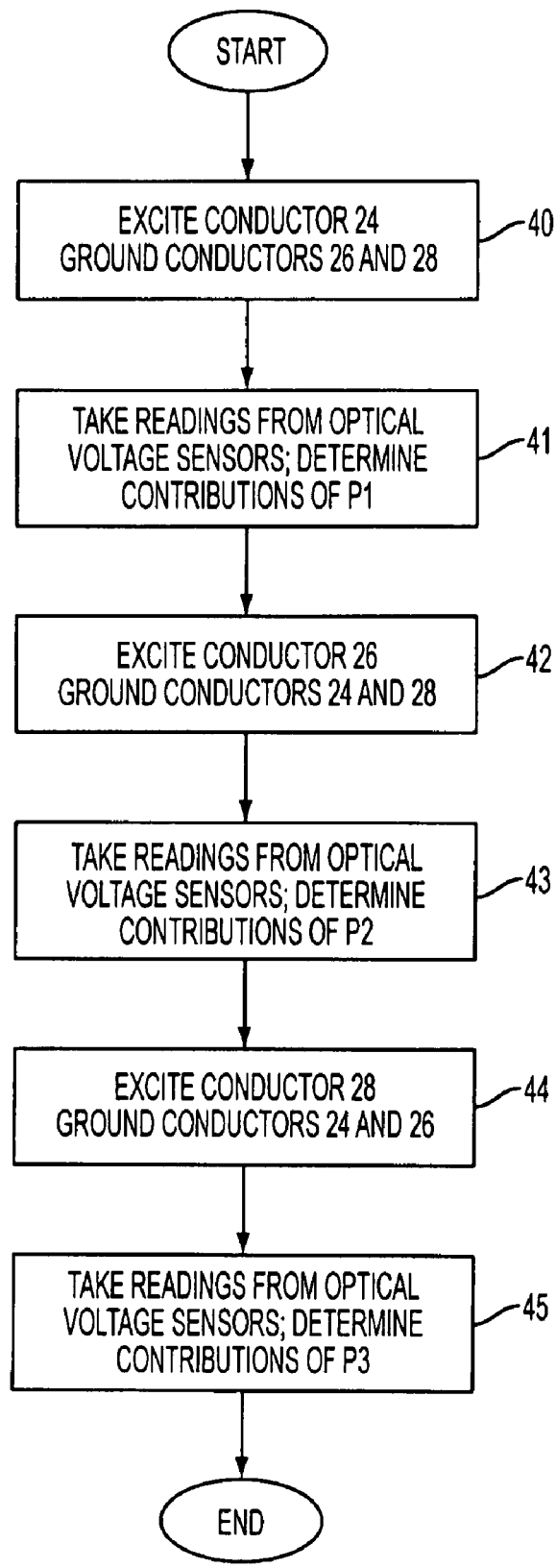
FIG. 4 is a flowchart depicting a method for calibrating a voltage sensing arrangement for a three-phase, gas insulated switchgear device according to an exemplary embodiment of the present invention.

Thus, to determine the actual electrical fields associated with voltages P1, P2 and P3 of the conductors 24, 26 and 28, respectively (and from those fields the actual voltages associated therewith), the coefficients of the contribution matrix M can be determined. One way to determine these coefficient values is described below with respect to the flow diagram of FIG. 4.

Therein, at step 40, conductor 24 is excited (e.g., by applying a test voltage thereto), while conductors 26 and 28 are grounded. Thus voltage readings taken at this time provide data from each optical voltage sensor which is solely the result of contributions from the electric fields associated with voltage P1 of conductor 24 at the location of each of the optical voltage sensors. Readings are taken from each of the optical voltage sensors 34, 36 and 38 to determine coefficient values a, d and g of contribution matrix M, i.e., the contribution of the electric fields at the location of each voltage sensor associated with voltage P1 to the output readings from each of the three optical voltage sensors, at step 41. Next, at step 42, conductor 26 is excited while conductors 24 and 28 are grounded. Again, readings are taken from all three optical voltage sensors 34, 36 and 38 to determine coefficient values b, e and h of contribution matrix M, i.e., the contribution of electric fields associated with voltage P2 at the location of each of the optical voltage sensors to the output readings from each of the three optical voltage sensors, at step 43. Then, at step 44, conductor 28 is excited while conductors 24 and 26 are grounded. Readings are taken from each of the three optical voltage sensors 34, 36 and 38 to determine coefficient values c, f and i of contribution matrix M, i.e., the contribution of electric fields associated with voltage P3 at the location of each of the optical voltage sensors to the output readings from each of the three optical voltage sensors, at step 45.

Once this calibration process has been performed, the values determined for matrix M can be used to process subsequent readings from the optical voltage sensors 34, 36 and 38 during operation of GIS devices operating in accordance with this exemplary embodiment of the present invention. Using the inverse of the matrix M, the voltages V1, V2 and V3 detected by optical voltage sensors 34, 36 and 38 can be compensated for contributions from the other conductors by transforming the detected voltages using an inverse of the contribution matrix as:

$$\begin{bmatrix} P1 \\ P2 \\ P3 \end{bmatrix} = M^{-1} \begin{bmatrix} V1 \\ V2 \\ V3 \end{bmatrix} \quad (2)$$

in the processor to derive the actual voltages (P1, P2, and P3) associated with each of the conductors 24, 26 and 28 in the GIS device according to this exemplary embodiment of the present invention.

Current Sensing Arrangement

Figure 5:
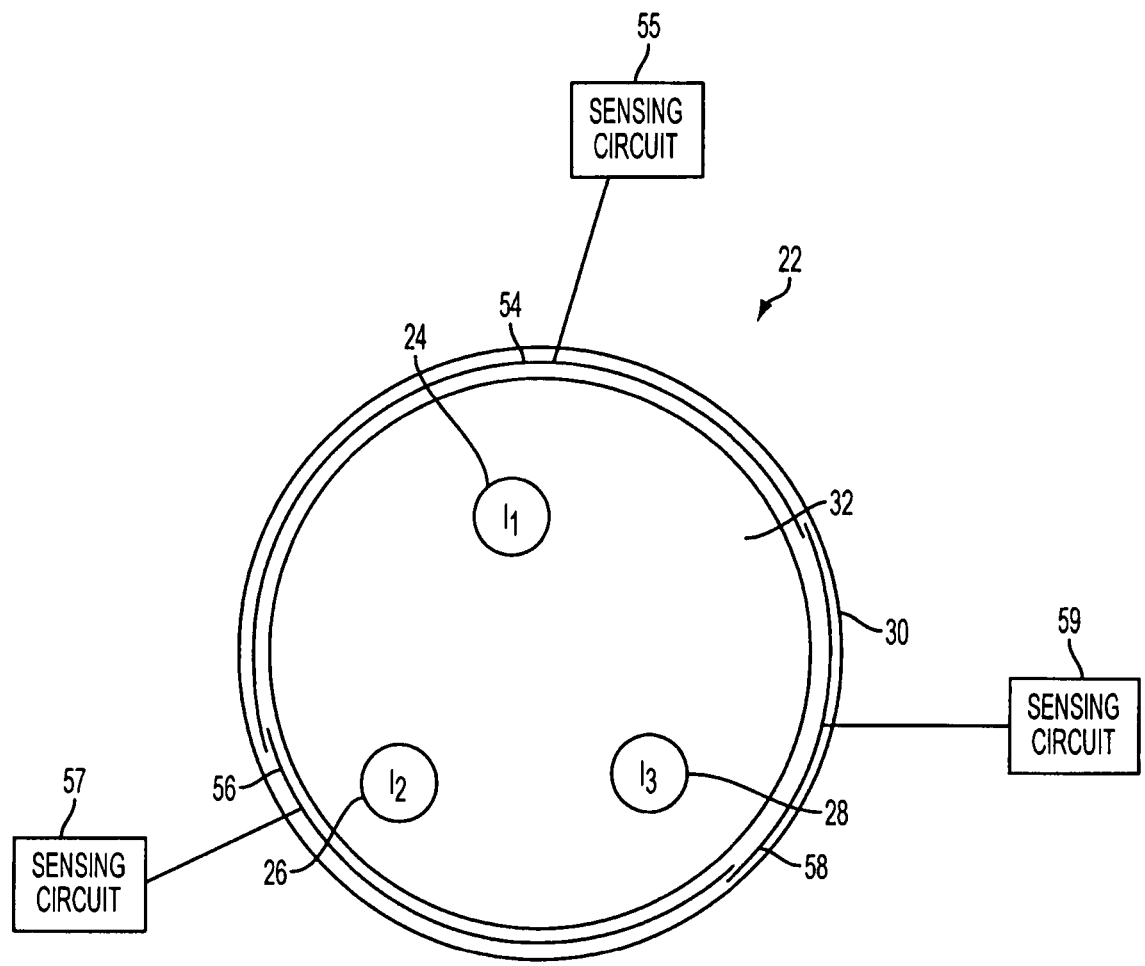
FIG. 5 illustrates a cross-section of a three-phase, gas insulated switchgear device including a current sensing arrangement according to an exemplary embodiment of the present invention.

According to another exemplary embodiment of the present invention, a cross-section 22 of a three phase GIS device includes an optical current sensing arrangement as shown in FIG. 5. Fiber optic current sensors operate based on the Faraday effect. Current flowing in a wire induces a magnetic field which, through the Faraday effect, rotates the plane of polarization of the light traveling in the optical fiber wound around the current carrying wire. Ampere's law can be stated as:

$$I = \oint H dL \quad (3)$$

where I is the electrical current, H is the magnetic field and the integral is taken over a closed path around the current carrying conductor.

Figure 6:
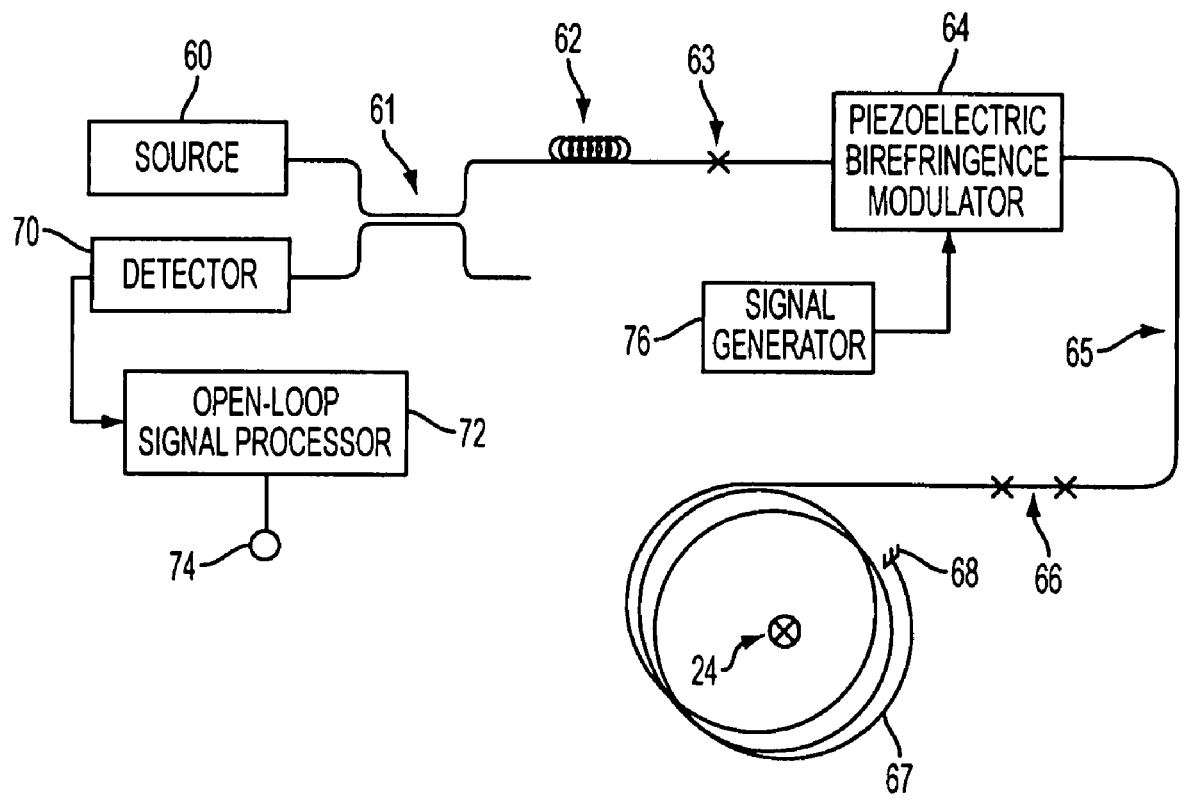
FIG. 6 illustrates an exemplary fiber optic current sensor which can be used in exemplary embodiments of the present invention.

In practice, this principle can be implemented in various fiber optic current sensing circuits, an example of which is shown in FIG. 6, wherein light from a source 60 propagates through a coupler 61 and a polarizer 62 to a 45-degree splice 63, where it divides equally into the two polarization states maintained throughout the rest of the optical circuit. A piezoelectric birefringence modulator 64 differentially modulates the phases of the light in the two polarization states. The modulator is driven by a modulator signal generator 76 that provides an electrical, periodic, alternating signal having either a square or sine wave. The light then propagates through a delay line 65, a mode converter 66 which converts the two linear states of polarization into two circular states of polarization, and through the sensing fiber 67. Sensing fiber 67 is disposed proximate to the current carrying wire 69. The light reflects off reflective termination 68 and retraces its way through the optical circuit, finally arriving at detector 70. Open-loop signal processor 72 converts the detected signal to an output 74 which is indicative of the current flowing in conductor 24. Note that this is only an example of one fiber optic current sensing circuit which can be used in conjunction with exemplary embodiments of the present invention. These principles, and other general details related to optical current sensors per se are described in U.S. Pat. No. 5,644,397 issued Jul. 1, 1997, to inventor James N. Blake and entitled "Fiber Optic Interferometric Circuit and Magnetic Field Sensor", U.S. Pat. No. 5,696,858 issued Dec. 9, 1997, to inventor James N. Blake and entitled, "Fiber Optics Apparatus and Method for Accurate Current Sensing" and U.S. Pat. No. 6,188,811 to James N. Blake and entitled "Fiber Optic Current Sensor", the disclosures of which are incorporated herein by reference.

However, a direct application of this technique to a three-phase, GIS device presents certain challenges. As seen in FIG. 6, the sensing fiber 67 needs to completely encircle the conductor 69 whose current is being measured. However, the gas filling the enclosure 20 of the GIS device creates a harsh environment which is inimical to the sensing fiber. Accordingly, it may not be practical to encircle the conductors 24, 26 and 28 with respective sensing fibers within the enclosure 20. Additionally, running optical fiber in the high electric field areas between conductors 24, 26 and 28 imposes challenges and complications.

Thus, returning to FIG. 5, according to an exemplary embodiment of the present invention, three sensing fibers 54, 56 and 58 (each having connected thereto a respective fiber optic sensing circuit such as that illustrated in FIG. 6 or a variant thereof and which are collectively referred to by respective reference numerals 55, 57 and 59) are provided in association with the three conductors 24, 26 and 28 of the three phase GIS device. In this exemplary embodiment, the sensors are disposed within the outer metallic layer 30 of the cross-section 22, although the present invention is not limited thereto, since the coefficient of expansion of the outer metallic layer 30 may present a more favorable mechanical environment for the sensing fiber than the coefficient of expansion associated with the insulating layer 32.

As in the voltage sensing arrangement described above, an issue arises in that each of the sensing fibers 54, 56 and 58 will receive contributions from the magnetic fields associated with all three conductors 24, 26 and 28 in the three phase GIS device. Accordingly, it is also useful to compensate the output from each of the three current sensors 55, 57 and 59 so that they independently track the current flowing through their respective conductors 24, 26 and 28.

A technique similar to that described above can be used to calibrate each of the current sensing circuits 55, 57 and 59. Specifically, the currents I1, I2 and I3 measured by each of the sensors are related to the magnetic fields produced by the currents I1', I2' and I3' running through conductors 24, 26 and 28 by the relationship:

$$\begin{bmatrix} I1 \\ I2 \\ I3 \end{bmatrix} = N \begin{bmatrix} I1' \\ I2' \\ I3' \end{bmatrix} \tag{4}$$

where N is a 3×3 matrix of contribution coefficients that can be written as:

$$N = \begin{bmatrix} abc \\ def \\ ghi \end{bmatrix}$$

Figure 7:
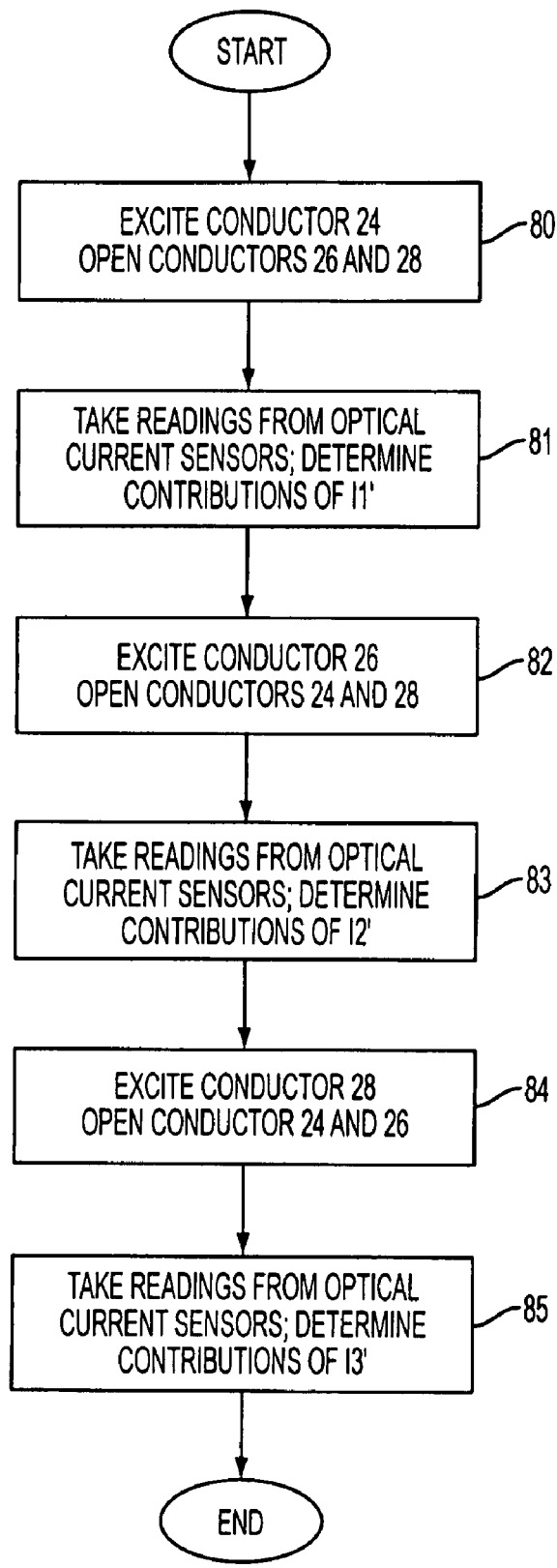
FIG. 7 is a flow chart illustrating a method for calibrating a current sensing arrangement for a three-phase, gas insulated switchgear device according to an exemplary embodiment of the present invention.

Thus, to determine the actual currents I1', I2' and I3' associated with the conductors 24, 26 and 28, respectively, the coefficients of the contribution matrix N are determined. One way to determine these coefficient values is described below with respect to the flow diagram of FIG. 7.

Therein, at step 80, conductor 24 is excited (e.g., by applying a test current thereto), while conductors 26 and 28 are open-circuited. Thus current readings taken at this time provide data from each optical current sensor which is solely the result of contributions from the magnetic fields associated with current I1' of conductor 24 at the location of each of the optical current sensors. Readings are taken from each of the current sensing circuits 55, 57 and 59 to determine coefficient values a, d and g of contribution matrix N, i.e., the contribution of the magnetic fields at the location of each current sensor associated with current I1' to the output readings from each of the three optical current sensors, at step 81. Next, at step 82, conductor 26 is excited while conductors 24 and 28 are open-circuited. Again, readings are taken from all three current sensing circuits 55, 57 and 59 to determine coefficient values b, e and h of contribution matrix N, i.e., the contribution of magnetic fields at the location of each current sensor associated with current I2' to the output readings from each of the three optical current sensors, at step 83. Then, at step 84, conductor 28 is excited while conductors 24 and 26 are open-circuited. Readings are taken from each of the current sensing circuits 55, 57 and 59 to determine coefficient values c, f and i of contribution matrix N, i.e., the contribution of magnetic fields at the location of each current sensor associated with current I3' to the output readings from each of the three optical current sensors, at step 85.

Once this calibration process has been performed, the values determined for matrix N can be used to process subsequent readings from the current sensing circuits 55, 57 and 59 during operation of GIS devices operating in accordance with this exemplary embodiment of the present invention. Using the inverse of the matrix N, the currents I1, I2 and I3 detected by current sensing circuits 55, 57 and 59 can be compensated for contributions from the other conductors by calculating:

$$\begin{bmatrix} I1' \\ I2' \\ I3' \end{bmatrix} = N^{-1} \begin{bmatrix} I1 \\ I2 \\ I3 \end{bmatrix} \tag{5}$$

in the processor to derive the actual currents associated with each of the conductors 24, 26 and 28 in the GIS device according to this exemplary embodiment of the present invention.

Figure 8:
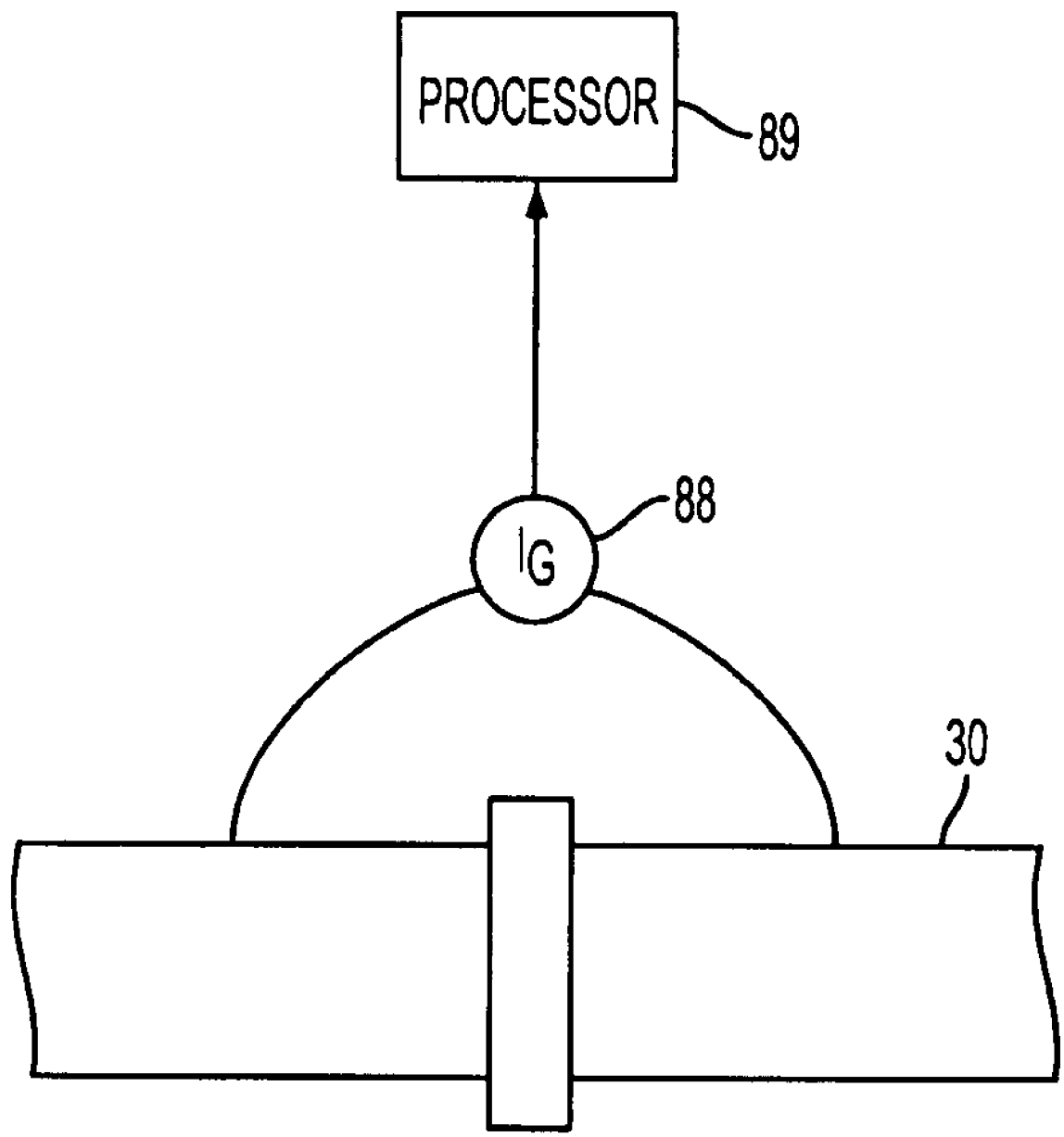
FIG. 8 depicts a ground current sensor which can be used in conjunction with exemplary embodiments of the present invention.

According to another exemplary embodiment of the present invention, the current readings associated with the foregoing current sensing arrangements can be further improved by taking into account contributions from the magnetic field associated with a ground current that may be carried along the outside of the outer metallic layer 30 of the GIS device. To further compensate for the contributions of the ground current picked up by sensing fibers 54, 56 and 58, a ground current sensor can be provided to measure the ground current as illustrated in FIG. 8. Therein a ground sensor 88 reads the ground current which travels along the outer metallic layer 30 and reports that ground current to the processor 89 which receives the readings from current sensors 55, 57 and 59. This current reading can be included in another transformation matrix equation system (four equations, four unknowns) to remove the contribution of the magnetic field associated with the ground current from the readings of the optical current sensors.

Figure 1:
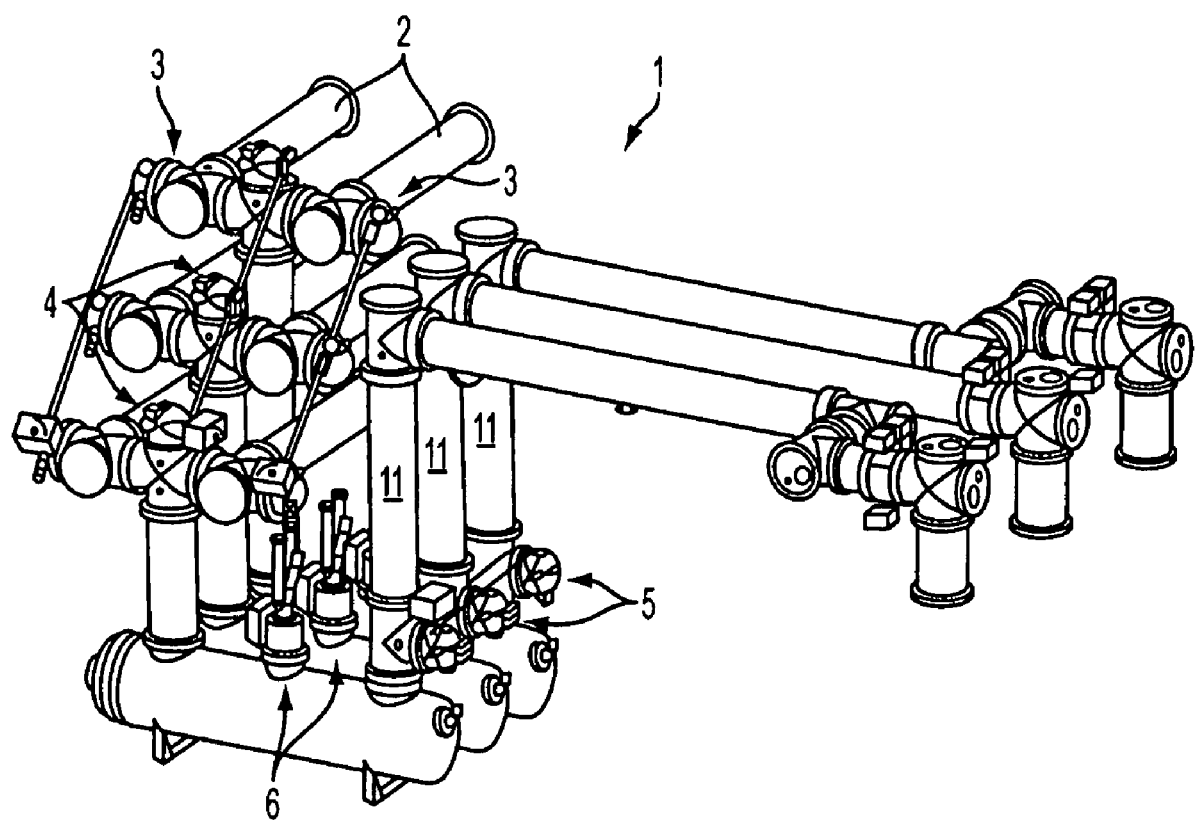
FIG. 1 depicts a conventional single phase (or segregated phase), gas insulated switchgear device.
Figure 2:
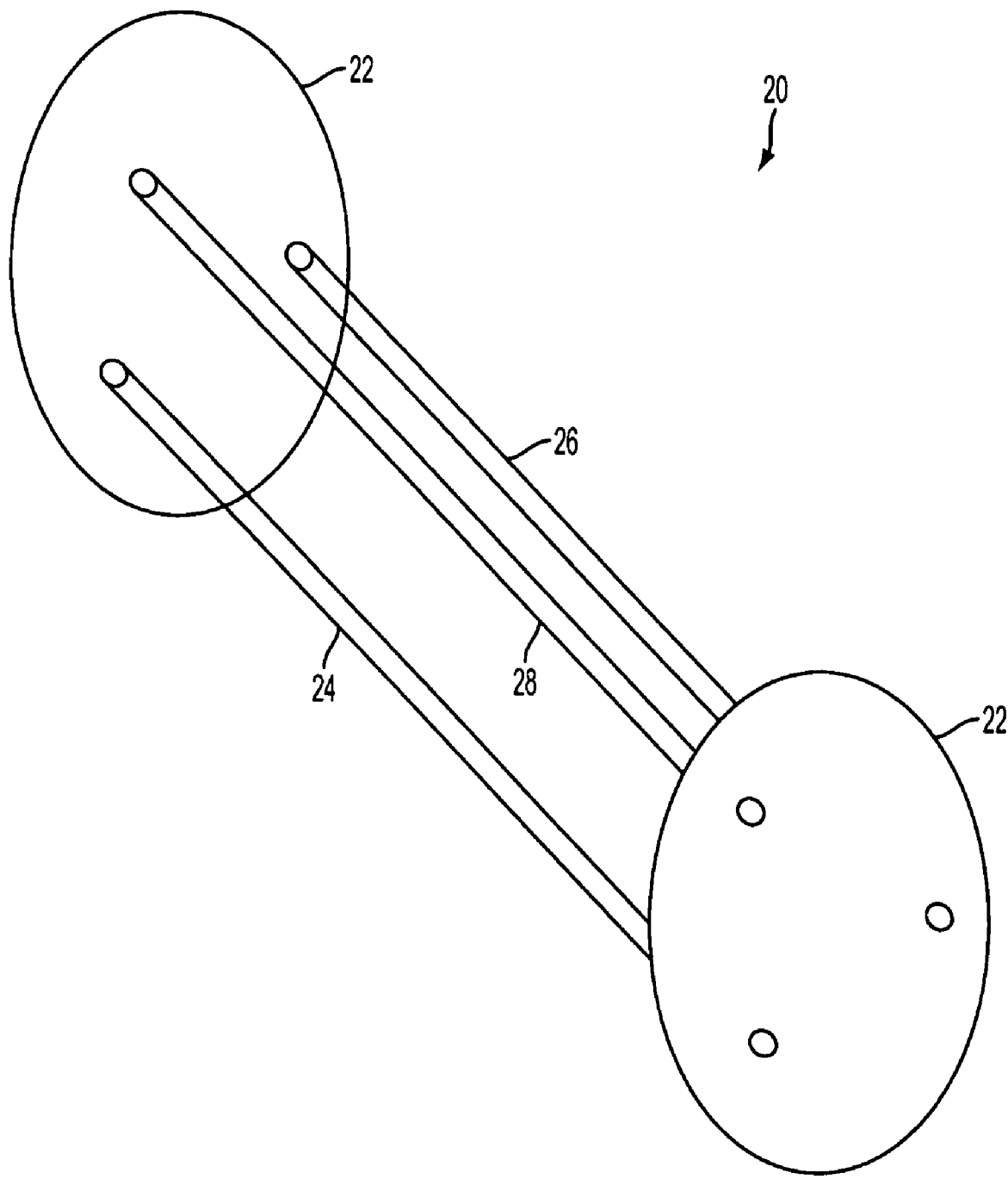
FIG. 2 shows a portion of a three-phase, gas insulated switchgear device with an outer cover thereof removed.
Figure 9:
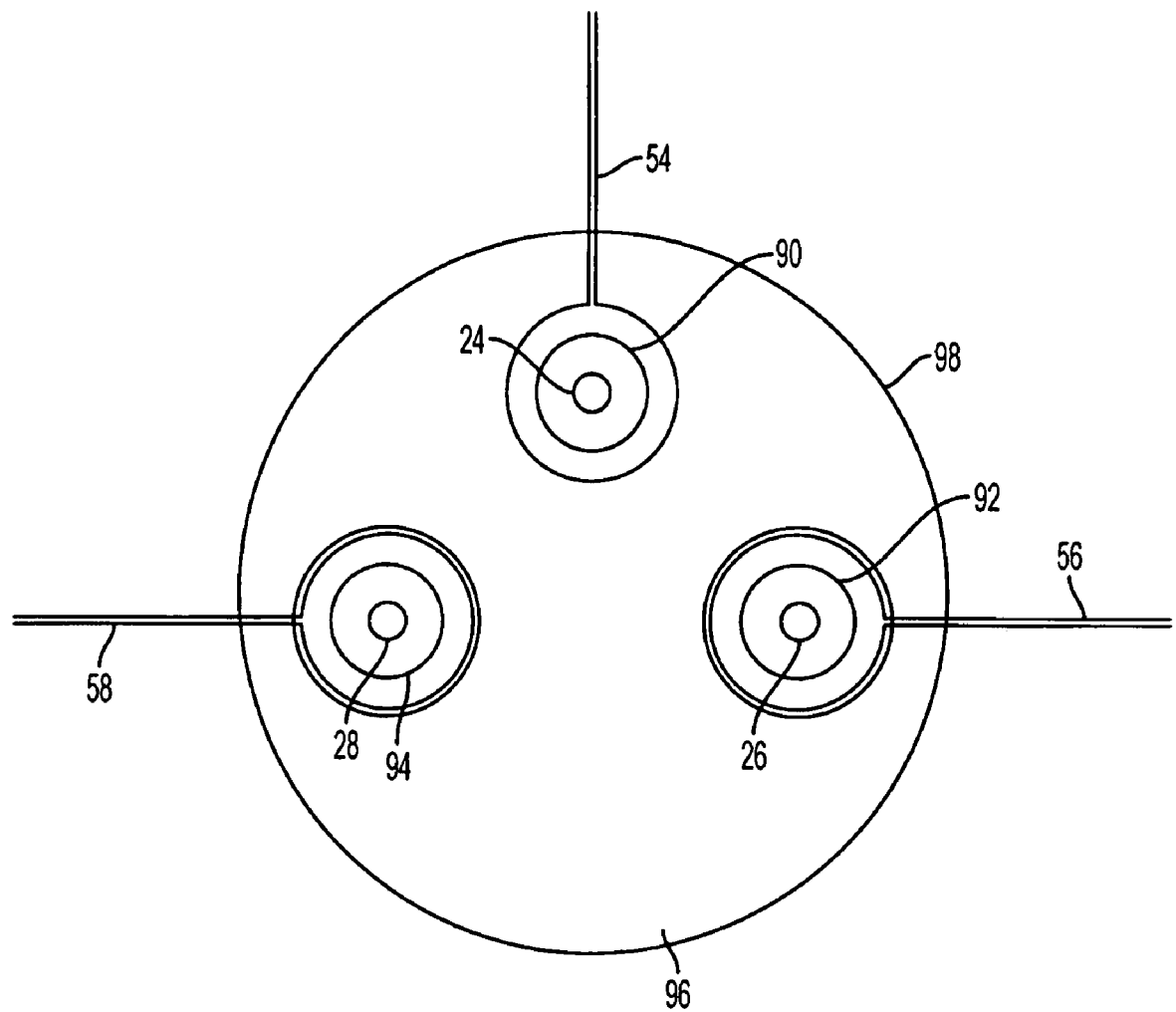
FIG. 9 illustrates a cross-section of a three-phase, gas insulated switchgear device including a simplified current sensing arrangement according to an exemplary embodiment of the present invention.

FIG. 9 shows another embodiment of a three-phase current sensor system. In this embodiment, the ground conductor 30 is extended in between the phase conductors, effectively creating a low electric-field path for the fiber optic current sensor between phases. The fiber optic current sensors 54, 56, and 58 can then be routed around individual phases, completely encircling (in full turns) each of their respective conductors 24, 26, and 28, and measuring each of their respective currents individually according to Ampere's law given in equation (3). In this case, matrix N and its inverse $N^{-1}$ are effectively unity matrices, i.e., I1=I1', I2=I2', and I3=I3'. The conductors 24, 26 and 28 can be insulated by insulators 90, 92 and 94, respectively, which can be insulating gas or solid insulators. The insulators 90, 92 and 94 can be embedded in a conductive or semi-conductive ground plate 96 which can in turn be encapsulated by ground conductor 98. The resulting ring structure shown in FIG. 9 can be inserted anywhere within the GIS enclosure of FIG. 2, e.g., by inserting a ring with the structure shown in FIG. 9 and bolting the sections together. This provides one alternative to placing the optic current sensors within an endcap and provides manufacturing flexibility, without exposing the optical fiber directly to, e.g., the insulating gas. According to another exemplary embodiment the optical fiber used within the ring can be coated with a hard plastic like polyether ether ketone (PEEK) to protect the fiber.

According to exemplary embodiments of the present invention, current sensors may be located in various places within a GIS device, e.g., within an endcap, in a ring near the endcap, or anywhere else in a GIS section. According to yet another exemplary embodiment of the present invention, a magnetic shield can be provided to the outside of the GIS device to prevent the fiber optic current sensors from being influenced by magnetic fields exterior to the device.

The above-described exemplary embodiments are intended to be illustrative in all respects, rather than restrictive, of the present invention. Thus the present invention is capable of many variations in detailed implementation that can be derived from the description contained herein by a person skilled in the art. For example, although the foregoing exemplary embodiments relate to gas insulated devices, a vacuum could be used instead of an insulating gas. As another example, although the foregoing is described for three-phase system, it can be applied to 2-phase or any other multi-conductor system as well. All such variations and modifications are considered to be within the scope and spirit of the present invention as defined by the following claims. No element, act, or instruction used in the description of the present application should be construed as critical or essential to the invention unless explicitly described as such. Also, as used herein, the article "a" is intended to include one or more items.

What is claimed is:

1. A three-phase, insulated electrical device comprising:
   an enclosure having first, second and third conductors extending therethrough, each of said first, second and third conductors associated with a different electrical phase;
   one of an insulating gas and a vacuum within said enclosure;
   a first voltage sensor, disposed within said enclosure and positioned proximate to said first conductor for sensing a first voltage associated therewith;
   a second voltage sensor, disposed within said enclosure and positioned proximate to said second conductor for sensing a second voltage associated therewith;
   a third voltage sensor, disposed within said enclosure and positioned proximate to said third conductor for sensing a third voltage associated therewith; and
   a processor, connected to said first, second and third voltage sensors, for receiving outputs therefrom and determining voltages associated with said first, second and third conductors by compensating for contributions to said outputs from said first, second and third voltage sensors associated with those of said first, second and third conductors other than a conductor proximate thereto.

2. The three-phase, insulated electrical device of claim 1, wherein said first, second and third voltage sensors are optical sensors.

3. The three-phase, insulated electrical device of claim 2, wherein each of said first, second and third voltage sensors are Pockels cell optical sensors.

4. The three-phase, insulated electrical device of claim 1, wherein said processor performs said compensation by transforming said outputs using a pre-determined contribution matrix.

5. The three-phase, insulated electrical device of claim 4, wherein said transforming step involves calculating:

$$\begin{bmatrix} P1 \\ P2 \\ P3 \end{bmatrix} = M^{-1} \begin{bmatrix} V1 \\ V2 \\ V3 \end{bmatrix}$$

where P1, P2 and P3 are voltages associated with said first, second and third conductors, respectively, $M^{-1}$ is said pre-determined contribution matrix and V1, V2 and V3 are voltage outputs from said first, second and third voltage sensors, respectively.

6. A method for sensing voltages associated with conductors in a three-phase, insulated electrical device, the method comprising the steps of:
   sensing a first voltage associated with a first conductor extending through said three-phase, insulated electrical device using a first voltage sensor proximate thereto;
   sensing a second voltage associated with a second conductor extending through said three-phase, insulated electrical device using a second voltage sensor proximate thereto;

sensing a third voltage associated with a third conductor extending through said three-phase, insulated electrical device using a third voltage sensor proximate thereto; and compensating said first, second and third voltages for sensed contributions associated with those of said first, second and third conductors other than a conductor proximate to a respective one of said first, second and third voltage sensors.

7. The method of claim 6, wherein said first, second and third voltage sensors are optical sensors.

8. The method of claim 7, wherein each of said first, second and third voltage sensors are Pockels cell optical sensors.

9. The method of claim 6, wherein said compensating step is performed by transforming said first, second and third voltages using a pre-determined contribution matrix.

10. The method of claim 9, wherein said transforming step involves calculating:

$$\begin{bmatrix} P1 \\ P2 \\ P3 \end{bmatrix} = M^{-1} \begin{bmatrix} V1 \\ V2 \\ V3 \end{bmatrix}$$

where P1, P2 and P3 are voltages associated with said first, second and third conductors, respectively, $M^{-1}$ is said pre-determined contribution matrix and V1, V2 and V3 are voltage outputs from said first, second and third voltage sensors, respectively.

11. A three-phase, insulated electrical device comprising:
an enclosure having first, second and third conductors extending therethrough, each of said first, second and third conductors associated with a different electrical phase;
one of an insulating gas and a vacuum within said enclosure;
a first current sensor, disposed within said enclosure and positioned proximate to said first conductor for sensing a first current associated therewith;
a second current sensor, disposed within said enclosure and positioned proximate to said second conductor for sensing a second current associated therewith;
a third current sensor, disposed within said enclosure and positioned proximate to said third conductor for sensing a third current associated therewith; and
a processor, connected to said first, second and third current sensors, for receiving outputs therefrom and determining currents associated with said first, second and third conductors by compensating for contributions to said outputs from said first, second and third current sensors associated with those of said first, second and third conductors other than a conductor proximate thereto.

12. The three-phase, insulated electrical device of claim 11, wherein said first, second and third current sensors are optical sensors.

13. The three-phase, insulated electrical device of claim 12, wherein each of said first, second and third current sensors include a sensing fiber disposed in said enclosure and proximate one of said respective first, second and third conductors.

14. The three-phase, insulated electrical device of claim 13, wherein said sensing fibers are disposed along an outer metallic layer of said three-phase, gas insulated device and at least partially overlap one another.

15. The three-phase, insulated electrical device of claim 11, wherein said processor performs said compensation by transforming said outputs using a pre-determined contribution matrix.

16. The three-phase, insulated electrical device of claim 15, wherein said transforming step involves calculating:

$$\begin{bmatrix} I1' \\ I2' \\ I3' \end{bmatrix} = N^{-1} \begin{bmatrix} I1 \\ I2 \\ I3 \end{bmatrix}$$

where I1', I2' and I3' are currents associated with said first, second and third conductors, respectively, $N^{-1}$ is said pre-determined contribution matrix and I1, I2 and I3 are current outputs from said first, second and third current sensors, respectively.

17. The three-phase, insulated electrical device of claim 11, wherein said processor further compensates said outputs for contributions by a magnetic field associated with a ground current carried by said device.

18. A method for sensing currents associated with conductors in a three-phase, insulated device, the method comprising the steps of:
sensing a first current associated with a first conductor extending through said three-phase, insulated electrical device using a first current sensor proximate thereto;
sensing a second current associated with a second conductor extending through said three-phase, insulated electrical device using a second current sensor proximate thereto;
sensing a third current associated with a third conductor extending through said three-phase, insulated electrical device using a third current sensor proximate thereto; and
compensating said first, second and third currents for sensed contributions associated with those of said first, second and third conductors other than a conductor proximate to a respective one of said first, second and third current sensors.

19. The method of claim 18, wherein said first, second and third current sensors are optical sensors.

20. The method of claim 19, wherein each of said first, second and third current sensors include a sensing fiber disposed in an enclosure and proximate to one of said respective first, second and third conductors.

21. The method of claim 20, wherein said sensing fibers are disposed along an outer metallic layer of said three-phase, insulated electrical device and at least partially overlap one another.

22. The method of claim 18, wherein said compensating step is performed by transforming said first, second and third currents using a pre-determined contribution matrix.

23. The method of claim 22, wherein said transforming step involves calculating:

$$\begin{bmatrix} I1' \\ I2' \\ I3' \end{bmatrix} = N^{-1} \begin{bmatrix} I1 \\ I2 \\ I3 \end{bmatrix}$$

where I1', I2' and I3' are currents associated with said first, second and third conductors, respectively, $N^{-1}$ is said predetermined contribution matrix and I1, I2 and I3 are voltage outputs from said first, second and third current sensors, respectively.

24. The method of claim 18, wherein said step of compensating further comprises the step of:
compensating said currents for contributions by a magnetic field associated with a ground current carried by said electrical device.

25. The three-phase, insulated electrical device of claim 4, wherein said predetermined contribution matrix is determined by:
exciting said first conductor and grounding said second and third conductors;
taking readings from each of said first, second and third voltage sensors to determine coefficient values of said pre-determined contribution matrix associated with contributions by electric fields associated with said first voltage;
exciting said second conductor and grounding said first and third conductors;
taking readings from each of said first, second and third voltage sensors to determine coefficient values of said pre-determined contribution matrix associated with contributions by electric fields associated with said second voltage;
exciting said third conductor and grounding said first and second conductors; and
taking readings from each of said first, second and third voltage sensors to determine coefficient values of said pre-determined contribution matrix associated with contributions by electric fields associated with said third voltage.

26. The method of claim 9, wherein said predetermined contribution matrix is determined by:
exciting said first conductor and grounding said second and third conductors;
taking readings from each of said first, second and third voltage sensors to determine coefficient values of said pre-determined contribution matrix associated with contributions by electric fields associated with said first voltage;
exciting said second conductor and grounding said first and third conductors;
taking readings from each of said first, second and third voltage sensors to determine coefficient values of said pre-determined contribution matrix associated with contributions by electric fields associated with said second voltage;
exciting said third conductor and grounding said first and second conductors; and
taking readings from each of said first, second and third voltage sensors to determine coefficient values of said pre-determined contribution matrix associated with contributions by electric fields associated with said third voltage.

27. The three-phase, insulated electrical device of claim 15, wherein said predetermined contribution matrix is determined by:
exciting said first conductor and grounding said second and third conductors;
taking readings from each of said first, second and third voltage sensors to determine coefficient values of said pre-determined contribution matrix associated with contributions by magnetic fields associated with said first current;
exciting said second conductor and grounding said first and third conductors;
taking readings from each of said first, second and third voltage sensors to determine coefficient values of said pre-determined contribution matrix associated with contributions by magnetic fields associated with said second current;
exciting said third conductor and grounding said first and second conductors; and
taking readings from each of said first, second and third voltage sensors to determine coefficient values of said pre-determined contribution matrix associated with contributions by magnetic fields associated with said third current.

28. The method of claim 22, wherein said predetermined contribution matrix is determined by:
exciting said first conductor and grounding said second and third conductors;
taking readings from each of said first, second and third voltage sensors to determine coefficient values of said pre-determined contribution matrix associated with contributions by magnetic fields associated with said first current;
exciting said second conductor and grounding said first and third conductors;
taking readings from each of said first, second and third voltage sensors to determine coefficient values of said pre-determined contribution matrix associated with contributions by magnetic fields associated with said second current;
exciting said third conductor and grounding said first and second conductors; and
taking readings from each of said first, second and third voltage sensors to determine coefficient values of said pre-determined contribution matrix associated with contributions by magnetic fields associated with said third current.

29. A multi-phase, insulated electrical device comprising:
an enclosure having at least first and second conductors extending therethrough, each of said first and second conductors associated with a different electrical phase;
one of an insulating gas and a vacuum within said enclosure;
a first voltage sensor, disposed within said enclosure and positioned proximate to said first conductor for sensing a first voltage associated therewith;
a second voltage sensor, disposed within said enclosure and positioned proximate to said second conductor for sensing a second voltage associated therewith; and
a processor, connected to said first and second voltage sensors, for receiving outputs therefrom and determining voltages associated with said first and second conductors by compensating for contributions to said outputs from said first and second voltage sensors associated with those of said first and second conductors other than a conductor proximate thereto.

30. A multi-phase, insulated electrical device comprising:
an enclosure having first and second conductors extending therethrough, each of said first and second conductors associated with a different electrical phase;
one of an insulating gas and a vacuum within said enclosure;
a first current sensor, disposed within said enclosure and positioned proximate to said first conductor for sensing a first current associated therewith;

a second current sensor, disposed within said enclosure and positioned proximate to said second conductor for sensing a second current associated therewith; and a processor, connected to said first and second current sensors, for receiving outputs therefrom and determining currents associated with said first and second conductors by compensating for contributions to said outputs from said first and second current sensors associated with those of said first and second conductors other than a conductor proximate thereto.

* * * * *